(12) United States Patent
Datta et al.

(10) Patent No.: US 7,138,305 B2
(45) Date of Patent: Nov. 21, 2006

(54) METHOD AND APPARATUS FOR IMPROVING STABILITY OF A 6T CMOS SRAM CELL

(75) Inventors: Suman Datta, Beaverton, OR (US); Brian S. Doyle, Portland, OR (US); Robert S. Chau, Beaverton, OR (US); Jack Kavalieros, Portland, OR (US); Bo Zheng, Beaverton, OR (US); Scott A. Hareland, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/165,724

(22) Filed: Jun. 24, 2005

(65) Prior Publication Data

US 2005/0237850 A1   Oct. 27, 2005

Related U.S. Application Data

(62) Division of application No. 10/679,124, filed on Oct. 2, 2003, now Pat. No. 6,970,373.

(51) Int. Cl.
*H01L 21/00* (2006.01)

(52) U.S. Cl. ............... 438/157; 438/283; 438/E21.623; 438/E21.637

(58) Field of Classification Search ................ 438/154, 438/157, 164, 706, 723, 283
See application file for complete search history.

(56) References Cited

U.S. PATENT DOCUMENTS

| 4,996,574 | A | 2/1991 | Shirasaki |
|---|---|---|---|
| 5,391,506 | A | 2/1995 | Tada et al. |
| 5,521,859 | A | 5/1996 | Ema et al. |
| 5,814,895 | A | 9/1998 | Hirayama |
| 5,821,629 | A | 10/1998 | Wen et al. |
| 6,391,782 | B1 * | 5/2002 | Yu .............................. 438/696 |
| 6,413,802 | B1 | 7/2002 | Hu et al. |
| 6,800,885 | B1 * | 10/2004 | An et al. ..................... 257/275 |
| 6,858,478 | B1 | 2/2005 | Chau et al. |
| 2003/0042542 | A1 | 3/2003 | Maegawa et al. |
| 2003/0067017 | A1 | 4/2003 | Ieong et al. |
| 2003/0102518 | A1 | 6/2003 | Fried et al. |
| 2004/0036126 | A1 | 2/2004 | Chau et al. |
| 2005/0017377 | A1 | 1/2005 | Joshi et al. |

OTHER PUBLICATIONS

Ieong, M et al: "Three dimensional CMOS devices and integrated circuits" Proceedings of the IEEE 2003 Custom Integrated Conference. (CICC 2003). San Jose, CA, Sep. 21-24, 2003, IEEE Custom Integrated Circuits Conference. CICC, New York, NY: IEEE, US, vol. Conf. 25, Sep. 21, 2003, pp. 207-214, XP010671206, ISBN: 0-7803-7842-3.

(Continued)

*Primary Examiner*—Quoc Hoang
(74) *Attorney, Agent, or Firm*—Cyndi M. Wheeler

(57) ABSTRACT

The present invention is a CMOS SRAM cell comprising two access devices, each access device comprised of a tri-gate transistor having a single fin; two pull-up devices, each pull-up device comprised of a tri-gate transistor having a single fin; and two pull-down devices, each pull-down device comprised of a tri-gate transistor having multiple fins. A method for manufacturing the CMOS SRAM cell, including the dual fin tri-gate transistor is also provided.

13 Claims, 14 Drawing Sheets

OTHER PUBLICATIONS

Nowak, E J et al: "Scaling beyond the 65 nm mode with FinFET-DGCMOS"; Proceedings of the IEEE 2003 Custom Integrated Circuits Conference. (CICC 2003). San Jose, CA, Sep. 21-24, 2003, IEEE Custom Integrated Conference. CICC, New York, NY: IEEE, US, vol. CONF. 25, Sep. 21, 2003, pp. 339-342, XP010671230, ISBN: 0-7803-7842-3.

Jones E C: "Doping challenges in exploratory devices for high performance logic", Ion Implantation Technology. 2002. Proceeding of the 14$^{th}$ International Conference on Sep. 22-27, 2002 Piscataway, NJ,USA, IEEE, US, Sep. 22, 2003, pp. 1-6, XP010676953, ISBN: 0-7803-7155-0.

Park T et al:, "PMOS body-tied FinFet (Omega MOSFET) characteristics", Device Research Conference, Jun. 23-25, 2003, Piscataway, NJ, USA, IEEE, Jun. 23, 2003, pp. 33-34; XP010655108, ISBN: 0-7803-7727-3.

Nowak E J et al: "A functional FinFet-DGCMOS SRAM cell"; International Electron Devices Meeting 2002. IEDM. Technical Digest. San Francisco, CA, Dec. 8-11, 2002, New York, NY: IEEE, US, Dec. 8, 2002, pp. 411-414, XP010626071, IBSN: 0-7803-7462-2.

Chau, Robert S. et al, "Tri-Gate Devices and Methods of Fabrication", U.S. Appl. No. 10/227,068, filed Aug. 23, 2002.

Chau, Robert S. et al, "Tri-Gate Devices and Methods of Fabrication", U.S. Appl. No. 10/367,263, filed Feb. 14, 2003.

International Search Report PCT/US2004/032442, date of mailing Jun. 16, 2005.

International Search Report PCT/US2004/032442.

T. Ludwig et al., "FinFET Technology for Future Microprocessors" 2003 IEEE, pp. 33-34.

Peter A. Stolk et al., "Modeling Statistical Dopant Fluctuations in MOS Transistors", 1998 IEEE, IEEE Transactions on Electron Devices, vol. 45, No. 9, Sep. 1998, pp. 1960-1971.

Evert Seevinck et al., "Static-Noise Margin Analysis of MOS SRAM Cells" 1987 IEEE, IEEE Journal of Solid-State Circuits, vol. SC-22, No. 5, Oct. 1987.

\* cited by examiner

METHOD AND APPARATUS FOR IMPROVING STABILITY OF A 6T CMOS SRAM CELL

This is a Divisional Application of Ser. No. 10/679,124 filed Oct. 2, 2003, which is now U.S. Pat. No. 6,970,373.

BACKGROUND OF THE INVENTION

1. Field of the Invention

The present invention relates to the field of semiconductor integrated circuit design and manufacturing, and more specifically to a 6T CMOS SRAM cell using tri-gate fully depleted substrate transistors and its methods of fabrication.

2. Discussion of Related Art

As silicon technology continues to scale from one generation to the next, the impact of intrinsic threshold voltage (Vt) variations in minimum geometry size bulk planar transistors reduces the CMOS SRAM cell static noise margin (SNM). This reduction in SNM caused by increasingly smaller transistor geometries is undesirable. SNM is further reduced when Vcc is scaled to a lower voltage.

Threshold voltage (Vt) variations in planar transistors arise mostly from the statistical fluctuation of the number and/or location of the dopant atoms in the depletion region of the transistors. The Vt variations pose barriers to the scaling of supply voltage, transistor size, and, hence, the minimum six transistor (6T) CMOS SRAM cell size. This limits the total transistor count for conventional 6T SRAM-dominated high performance CMOS ASICs and microprocessors due to die size and cost constraints.

Currently, the problem of reduced SNM resulting from Vt instability of the SRAM cell transistors is solved at the circuit/layout level by either (a) increasing the minimum supply voltage (Vccmin) needed to operate the cell and keeping the minimum geometry size transistors or (b) increasing the channel length and width of the cell transistors to enable a lower minimum operating voltage at the expense of the minimum cell size. At the device level, in planar devices, Vt mismatch arising from random dopant fluctuations (RDF) can be minimized by box-shaped wells or super-steep retrograde wells at the expense of additional fabrication process complexity.

A 6T CMOS SRAM cell circuit diagram using planar transistors is illustrated in FIG. 1. The SRAM cell consists of two N-type access devices 102, two N-type pull-down devices 104, and two P-type pull-up devices 106.

FIG. 2 illustrates a 6T CMOS SRAM cell layout using planar transistors. The gate of each access device is located in region 202. The gate of each pull-down device is located in region 204. The gate of each pull-up device is located in region 206. The gate regions are indicated by a region of polysilicon 214 over a region of P-type diffusion 212 or N-type diffusion 210. Metal layers 218 provide power (Vcc) and ground (Vss). Metal layers 218 may also connect the gate/source/drain of one planar transistor in the cell to the gate/source/drain of another transistor in the cell, and may interconnect one cell to another. Contacts 216 indicate regions where connections may be made to the metal layers. For a given Vcc, the cell ratio is tailored by sizing each access transistor width and each pull-down transistor width to achieve the maximum SNM value.

FIG. 3 is a graph 300 which illustrates the impact of supply voltage scaling on a typical 6T CMOS SRAM cell using planar transistors. The noise margin values assume nominal threshold voltage, nominal Vcc, and nominal device sizes. Dashed line 310 indicates the minimum desired value for SNM, 240 mV. The graph shows that as Vcc scales down from 2V to less than 1V, the cell ratio must increase in order to maintain a desirable SNM value. For a cell ratio of 1.5 (302), the minimum voltage that can be achieved while maintaining a nominal SNM of 240 mV is slightly less than 2.0V. When the cell ratio is increased to 2.0 (304), the minimum voltage that can be achieved while maintaining a nominal SNM is less than 1.5V. If the cell ratio is increased to 3.5 (306), the minimum voltage may be reduced to less than 1.0V. However, increasing the cell ratio corresponds to an area penalty in the form of increasing cell size.

DETAILED DESCRIPTION OF THE PRESENT INVENTION

The present invention is a 6T CMOS SRAM cell using non-planar tri-gate transistors, and its method of fabrication. In the following description, numerous specific details are set forth in order to provide a thorough understanding of the present invention. In other instances, well-known semiconductor process and manufacturing techniques have not been described in particular detail in order to not unnecessarily obscure the present invention.

The present invention takes advantage of the higher drive current performance of non-planar tri-gate transistors to improve the stability of the 6T CMOS SRAM cell, thus enabling lower supply voltage operation and reduced cell layout sizes. Tri-gate transistors in multiple fin configurations can deliver more drive current for a given layout width than a planar transistor.

Figure 1:
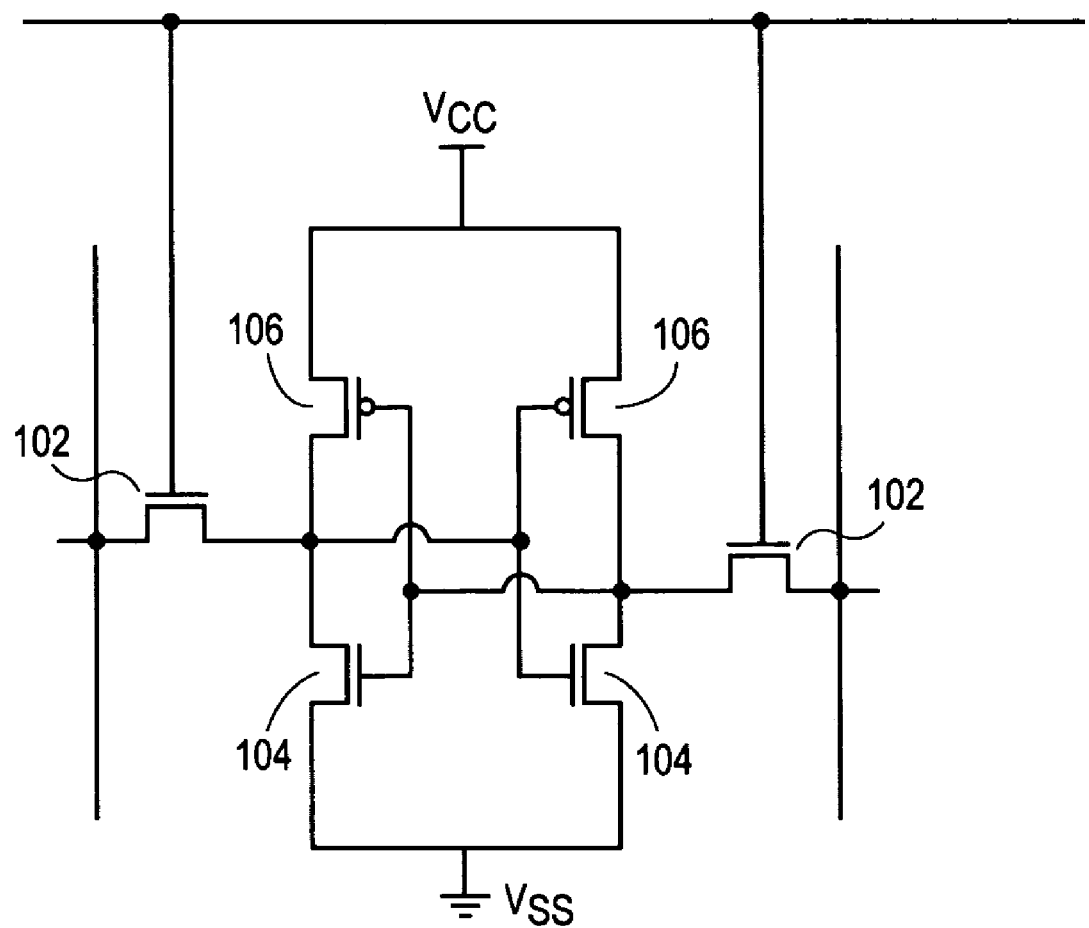
FIG. 1 is an illustration of a prior art 6T CMOS SRAM cell circuit diagram using planar transistors.
Figure 2:
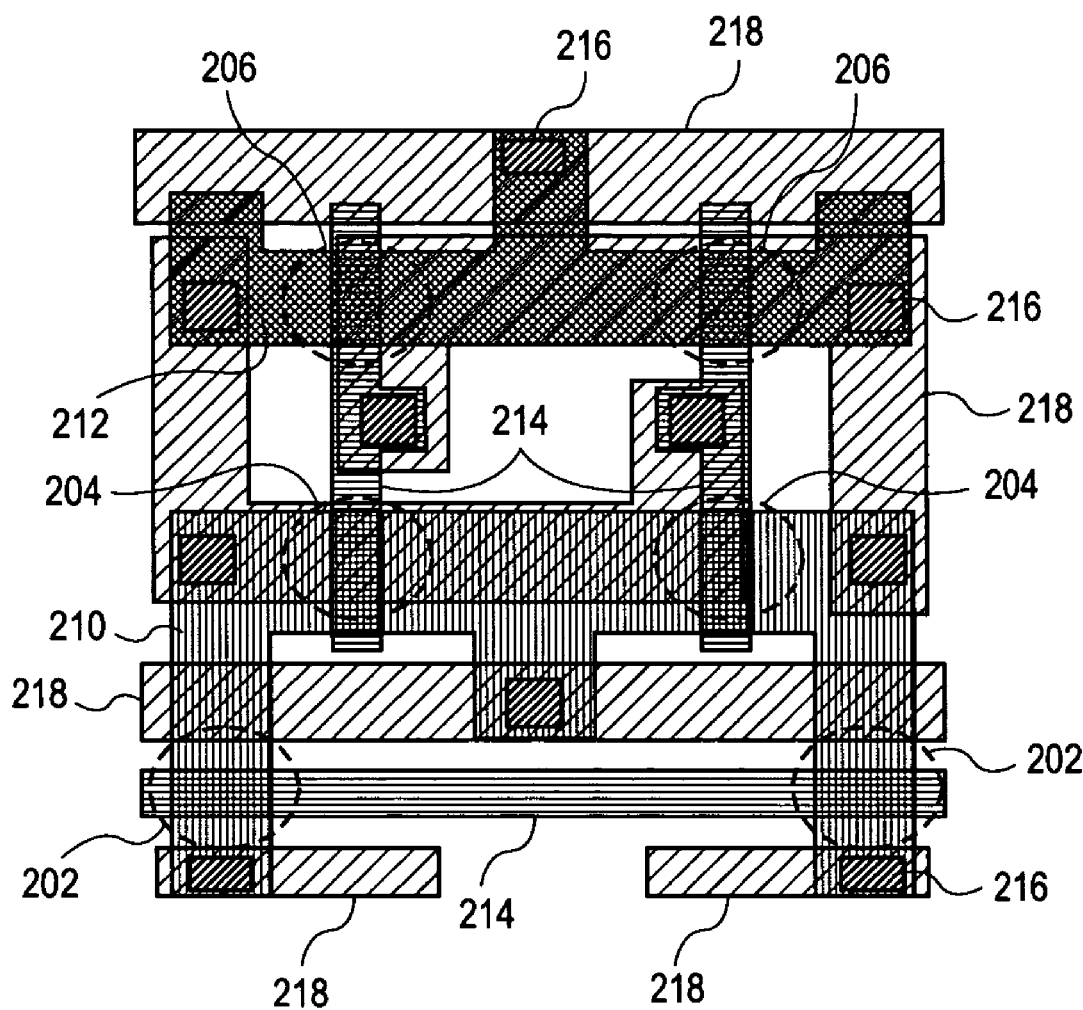
FIG. 2 is an illustration of a prior art 6T CMOS SRAM cell layout using planar transistors.
Figure 3:
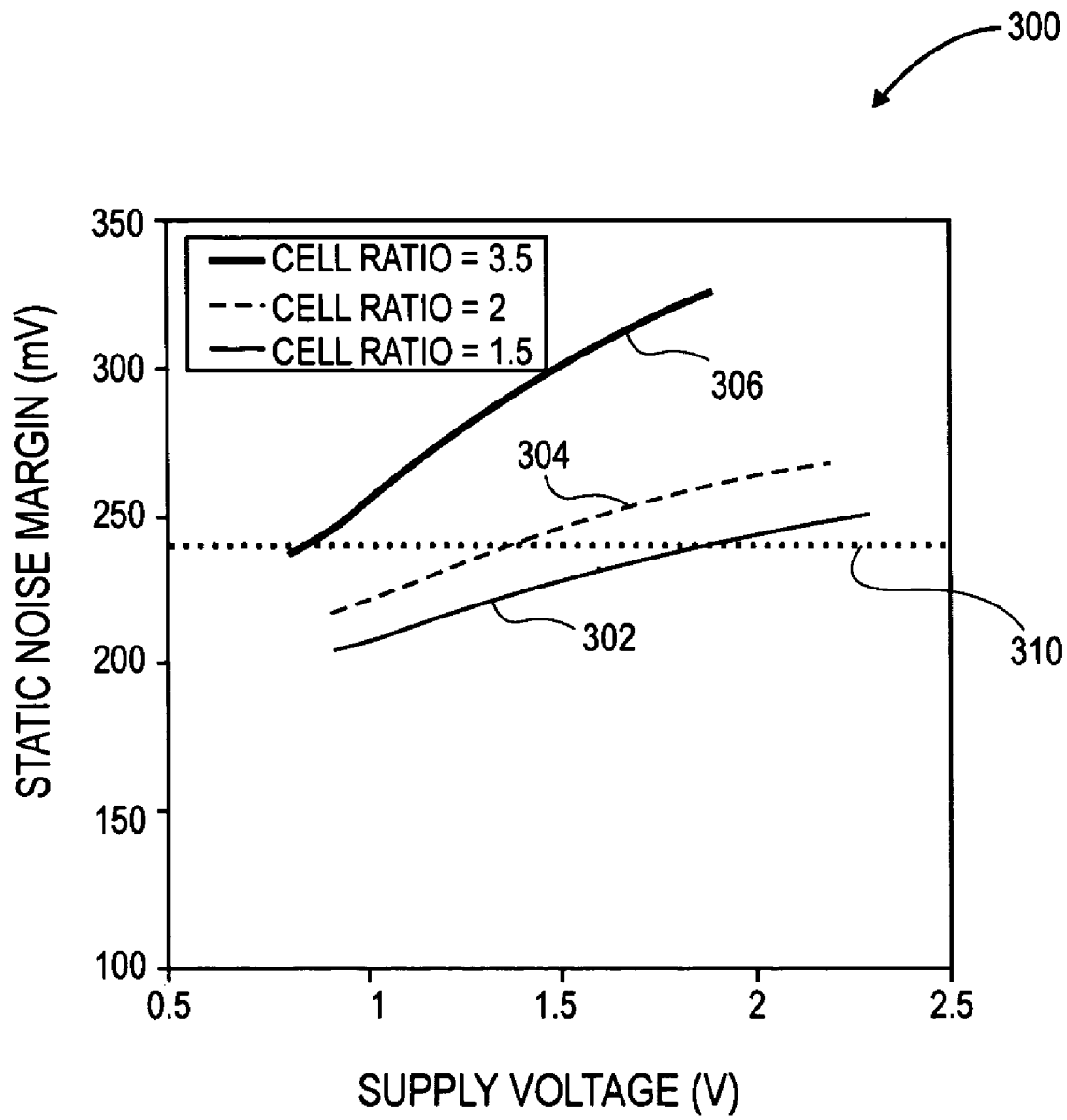
FIG. 3 is a graph which illustrates Static Noise Margin as a function of Supply Voltage for a 6T SRAM cell of varying cell ratios.
Figure 4:
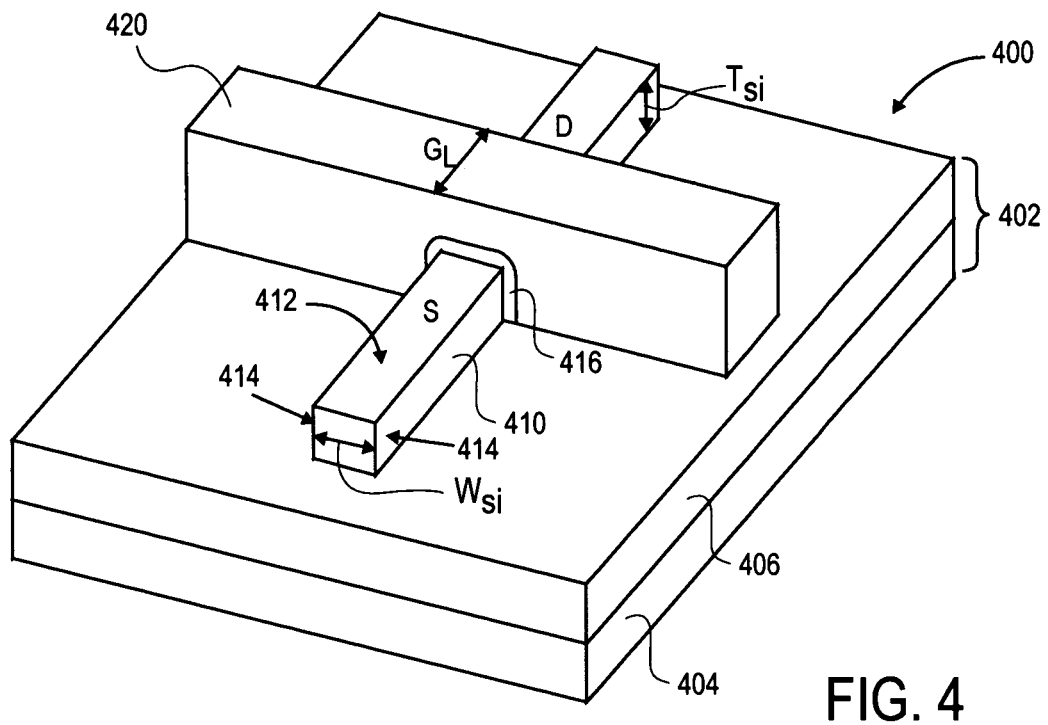
FIG. 4 is a cross-sectional view of a single-fin tri-gate transistor.

FIG. 4 illustrates a cross section of a typical single fin tri-gate transistor 400. A single fin tri-gate transistor is a tri-gate transistor having a single semiconductor body 410. The semiconductor body will also be referred to as a "semiconductor fin." The semiconductor body is formed on an insulating substrate 402. The insulating substrate is comprised of a buried oxide or other insulating layer 406 over a silicon or other semiconductor substrate 404. A gate dielectric 416 is formed over the top and on the sides of the semiconductor fin 410. A gate electrode 420 is formed over the top and on the sides of the gate dielectric. The gate electrode has a gate length $G_L$. The source, S, and drain, D, regions are formed in the semiconductor fin on either side of the gate electrode.

The semiconductor fin has a top surface 412 and laterally opposite sidewalls 414. The semiconductor fin has a height or thickness equal to Tsi. The semiconductor fin has a width equal to Wsi. The gate width of a single fin tri-gate transistor is equal to the sum of the gate widths of each of the three gates formed on the semiconductor body, or, Tsi+Wsi+Tsi.

Figure 5:
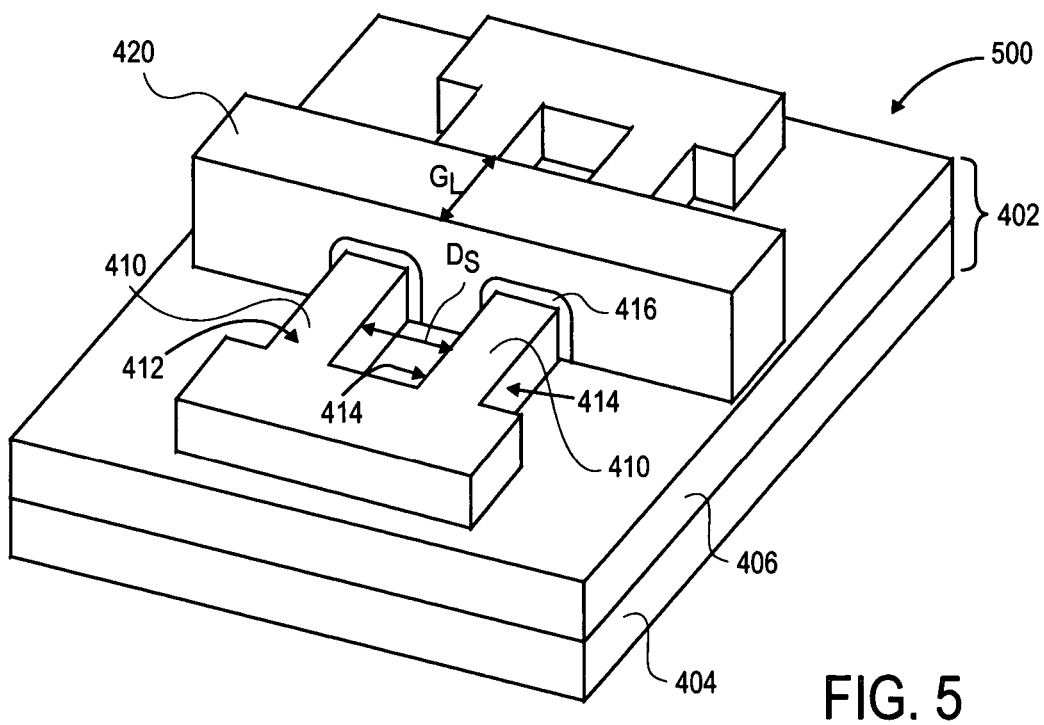
FIG. 5 is a cross-sectional view of a dual fin tri-gate transistor.

FIG. 5 illustrates a cross section of a typical dual fin tri-gate transistor, 500, according to one embodiment of the present invention. A dual fin tri-gate transistor is a tri-gate transistor having two semiconductor bodies, or fins, 410 over an insulating substrate 402, the two fins each having a gate dielectric formed on the top surface and laterally opposite sidewalls, and sharing a single gate electrode formed over and around the gate dielectric. Each semiconductor fin has a top surface 412 and laterally opposite sidewalls 414. The semiconductor fins are separated by a distance Ds. Patterning with normal lithographic techniques allows a minimum Ds of approximately 240 nm. The gate width of a dual fin tri-gate transistor is equal to the sum of the gate widths for each of the two semiconductor bodies, or [2(Tsi1)+(Wsi1)]+[2(Tsi2)+(Wsi2)]. If the semiconductor bodies are formed in such a way that each semiconductor body has substantially similar dimensions, the gate width of a dual fin tri-gate transistor is effectively twice the gate width of a single fin tri-gate transistor. The gate width of a tri-gate transistor can be further increased by adding additional fins to the tri-gate transistor. A tri-gate transistor in a multiple fin configuration can deliver more drive current for a given layout width than a planar transistor because a tri-gate transistor having the same size as a planar transistor will have a larger gate width.

Figure 6:
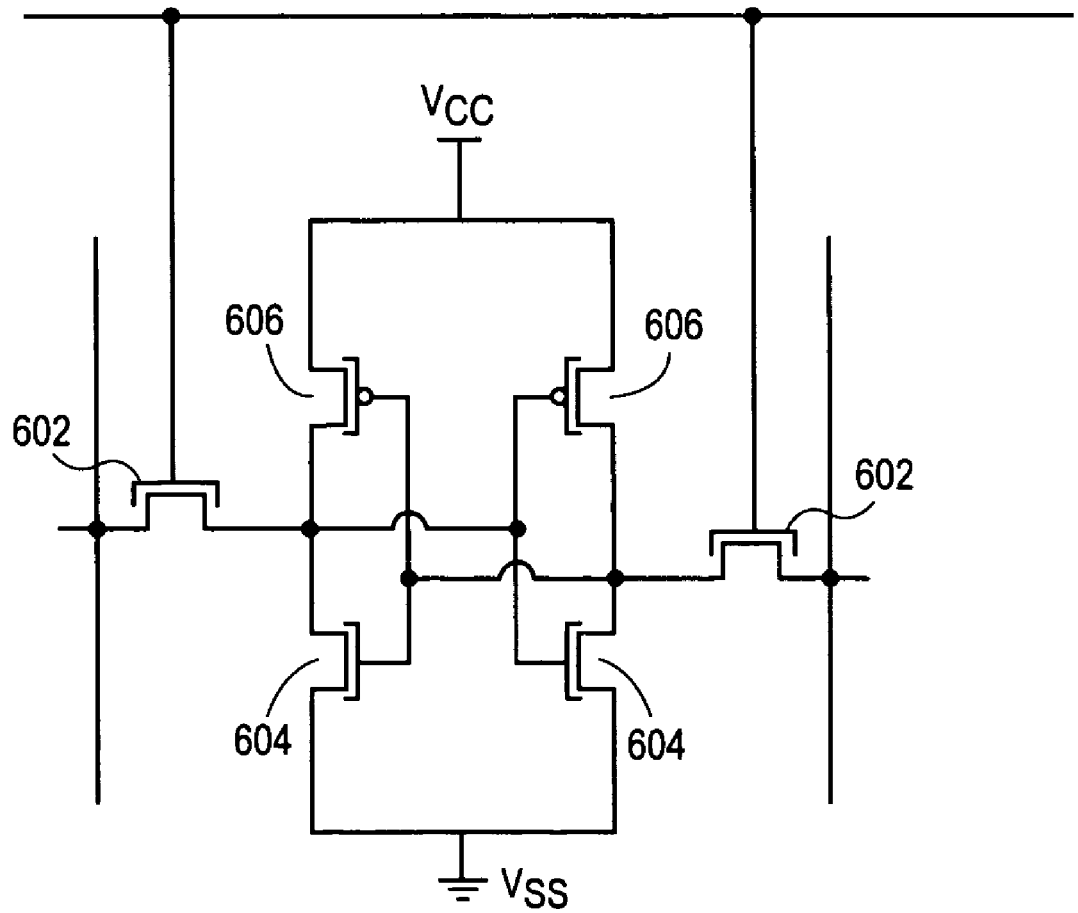
FIG. 6 is an illustration of a 6T CMOS SRAM cell circuit diagram with tri-gate transistors according to one embodiment of the present invention.

FIG. 6 illustrates a 6T CMOS SRAM cell circuit diagram using tri-gate transistors according to one embodiment of the present invention. The SRAM cell consists of two N-type access devices, 602, two N-type pull-down devices, 604, and two P-type pull-up devices, 606. Each of the N-type access devices 602 is a single fin tri-gate transistor. Each of the P-type pull-up devices 606 is a single fin tri-gate transistor. Each of the N-type pull-down devices 604 is a dual fin tri-gate transistor. Using a dual fin tri-gate transistor as the pull-down device allows a circuit designer to achieve a higher cell ratio for the SRAM cell. The dual fin tri-gate transistor will deliver more current than the single fin tri-gate transistors, thus increasing the cell ratio without increasing the cell layout size.

The cell ratio of an SRAM cell is defined as the ratio of the transconductance factor of the pull-down N-type transistor to the transconductance factor of the access N-type transistor. The transconductance factor of a transistor is equal to the ratio of gate width to gate length times the mobility and gate capacitance. Where mobility and gate capacitance are constant across the access and pull-down transistors, the transconductance factor becomes the ratio of the transistor gate width to the transistor gate length. The transconductance factor of the dual fin tri-gate transistor will be greater than that of the planar transistor, because the transistor gate width of the dual fin tri-gate transistor is greater that of the planar transistor, within the same layout area. Furthermore, the transconductance factor of the dual fin tri-gate transistor will be greater than that of the single fin tri-gate transistor because the ratio of gate width to gate length for the dual fin device will be greater than that of the single fin device. Using a dual fin tri-gate transistor as the pull-down device increases the transconductance factor of the pull-down device, thus increasing the cell ratio of the SRAM cell. As described above, higher, and thus more desirable static noise margin (SNM) levels can be achieved by increasing the cell ratio. The use of non-planar tri-gate transistors in the design of an SRAM cell allows the cell ratio to be increased without increasing the physical cell layout size. Table 1, below, is a comparison of cell ratios for an SRAM cell using planar transistors and an SRAM cell using tri-gate transistors, where each of the SRAM cells has the same layout area.

TABLE 1

|  | Transistor | Transconductance |
| --- | --- | --- |
| Planar SRAM Cell* | Pull Down | 1.6 |
| Cell Ratio = 1.5 | Access | 1.1 |
|  | Pull Up | 1.3 |
| Tri-gate SRAM Cell* | Pull Down | 6.0 |
| Cell Ratio = 2.15 | Access | 2.8 |
|  | Pull Up | 3.0 |

*Note:
Cell layout areas are the same for each cell

Figure 7:
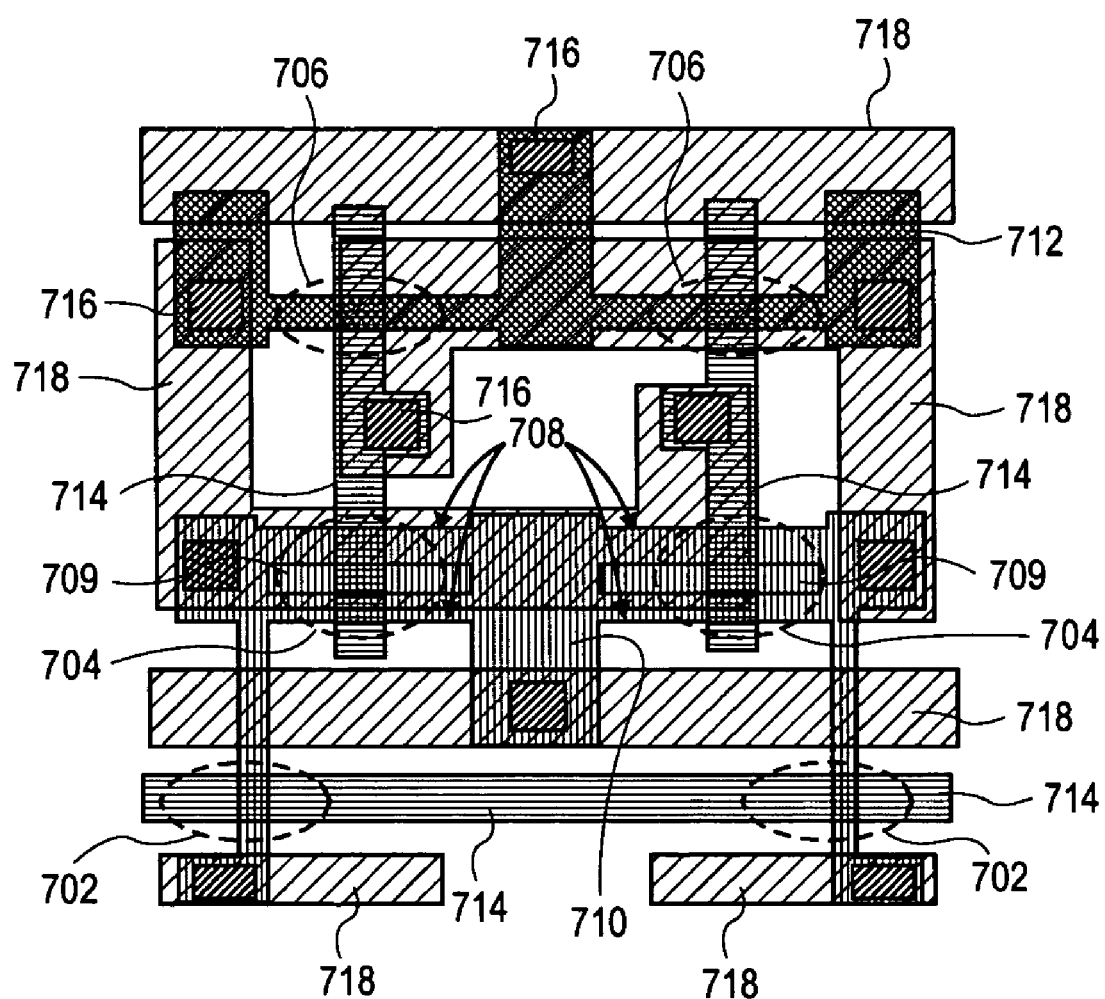
FIG. 7 is an illustration of a 6T CMOS SRAM cell layout using single and dual fin tri-gate transistor according to one embodiment of the present invention.

FIG. 7 illustrates a 6T CMOS SRAM cell layout using tri-gate transistors according to one embodiment of the present invention. The gate of each access device is located in region 702. The gate of each pull-down device is located in region 704. Each of the pull-down devices is a dual fin device. Each fin of the device is indicated by region 708 on either side of sacrificial block 709. Sacrificial block 709 is used to form the fins in close proximity to one another. The use of sacrificial block 709 allows the fins to be spaced less than 100 nm from one another, which would not be possible using traditional lithography. The gate of each pull-up device is located in region 706. The gate regions are indicated by a region of polysilicon 714 over a region of P-type diffusion 712 or N-type diffusion 710. Metal layers 718 provide power (Vcc) and ground (Vss). Metal layers 718 may also connect the gate/source/drain of one planar transistor in the cell to the gate/source/drain of another transistor in the cell, and may connect one SRAM cell to another. Contacts 716 indicate regions where connections may be made to the metal layers. For a given Vcc, the cell ratio is tailored by sizing the gate width of each access transistor and each pull-down transistor to achieve the maximum SNM value. As described above, using an N-type dual fin tri-gate device as the pull-down device and an N-type single fin tri-gate device as the access device allows tri-gate SRAM cell to be designed having a higher cell ratio in the same layout area as a planar SRAM cell.

Figure 8:
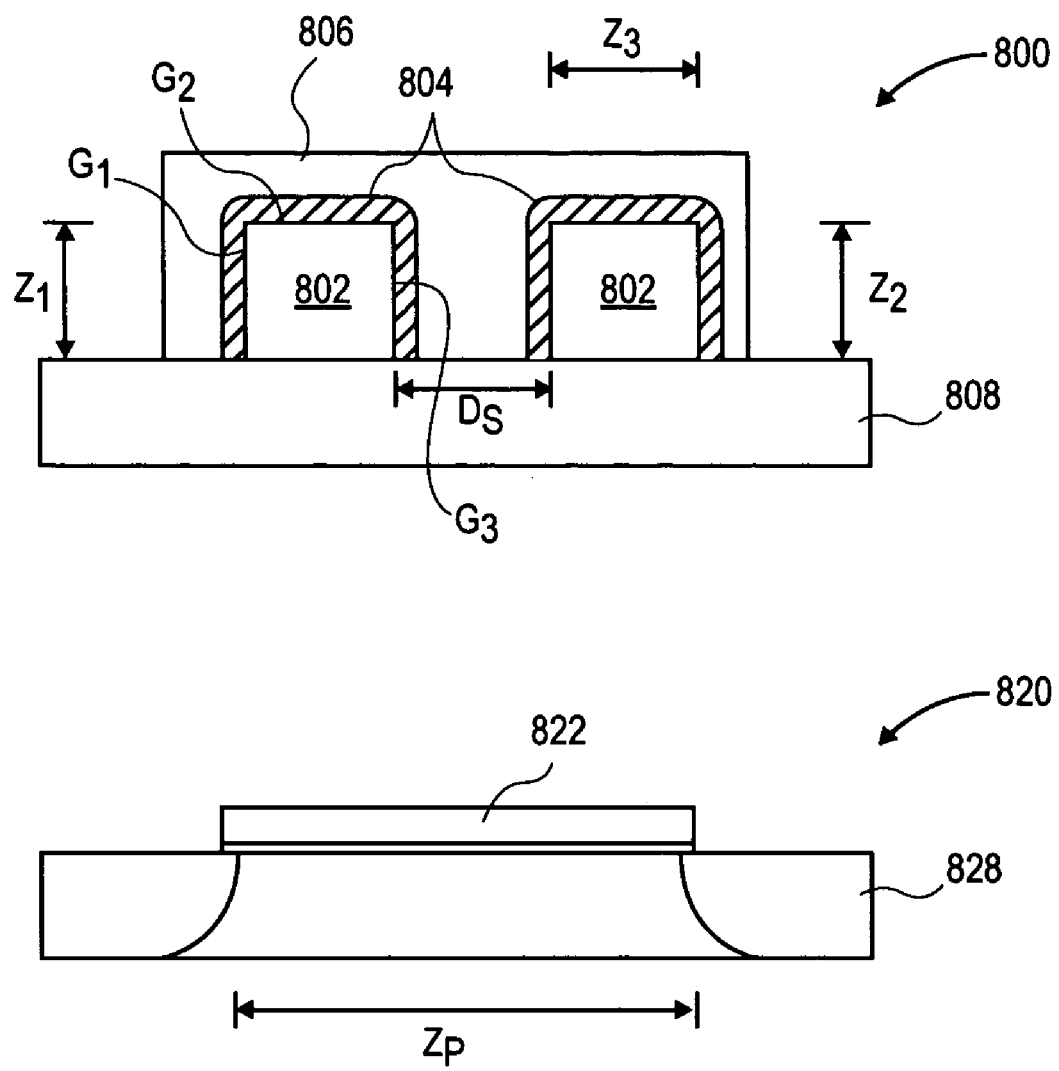
FIG. 8 is a comparison of the gate width of a dual fin tri-gate transistor according to one embodiment of the present invention and a planar transistor.

FIG. 8 is a comparison of the gate width of a dual fin tri-gate transistor according to one embodiment of the present invention to the gate width of a planar transistor in the same layout area. Cross-section 800 shows a dual fin tri-gate transistor formed on an insulating substrate 808. The fins of the tri-gate transistor are formed by semiconductor bodies 802. The fins are separated by a distance, Ds, which is determined by the width of the sacrificial block described above. The distance, Ds, may be defined by the minimum lithography feature size that may be patterned. A gate dielectric 804 covers each fin of the tri-gate transistor in the gate region. Gate electrode 806 is formed over and around each semiconductor fin and gate dielectric layer. Three gates, G1, G2, and G3 are formed for each fin of the dual fin tri-gate transistor. Each gate formed has a gate width. The gate width of G1 is equal to Z1, or the height of the fin. The gate width of G2 is equal to Z2, or the width of the fin. The gate width of G3 is equal to Z3, or the height of the fin. The total gate width of each fin is equal to Z1+Z2+Z3. For a dual fin tri-gate transistor, the total gate width is equal to 2(Z1+ Z2+Z3). A tri-gate transistor having N fins has a total gate width equal to N(Z1+Z2+Z3). In one embodiment of the present invention, Z1=60 nm, Z2=60 nm, Z3=60 nm, and $D_s$=60 nm. The gate width of the tri-gate transistor according to this embodiment is 2(60 nm+60 nm+60 nm), or 360 nm. The total layout width used is equal to Z3+$D_s$+Z3, or (60 nm+60 nm+60 nm)=180 nm.

Cross-section 820 shows a planar transistor formed on a semiconductor substrate 828. The gate width of the planar transistor is equal to the width of transistor gate 822, or Zp. For a layout width of 180 nm, the gate width of planar transistor 820 is equal to 180 nm. Because the gate width of the tri-gate transistor is two times that of the planar transistor for the same layout area, it is possible to increase the cell ratio of a 6T CMOS SRAM cell by designing the cell using single and dual fin tri-gate transistors according to one embodiment of the present invention.

Figure 9:
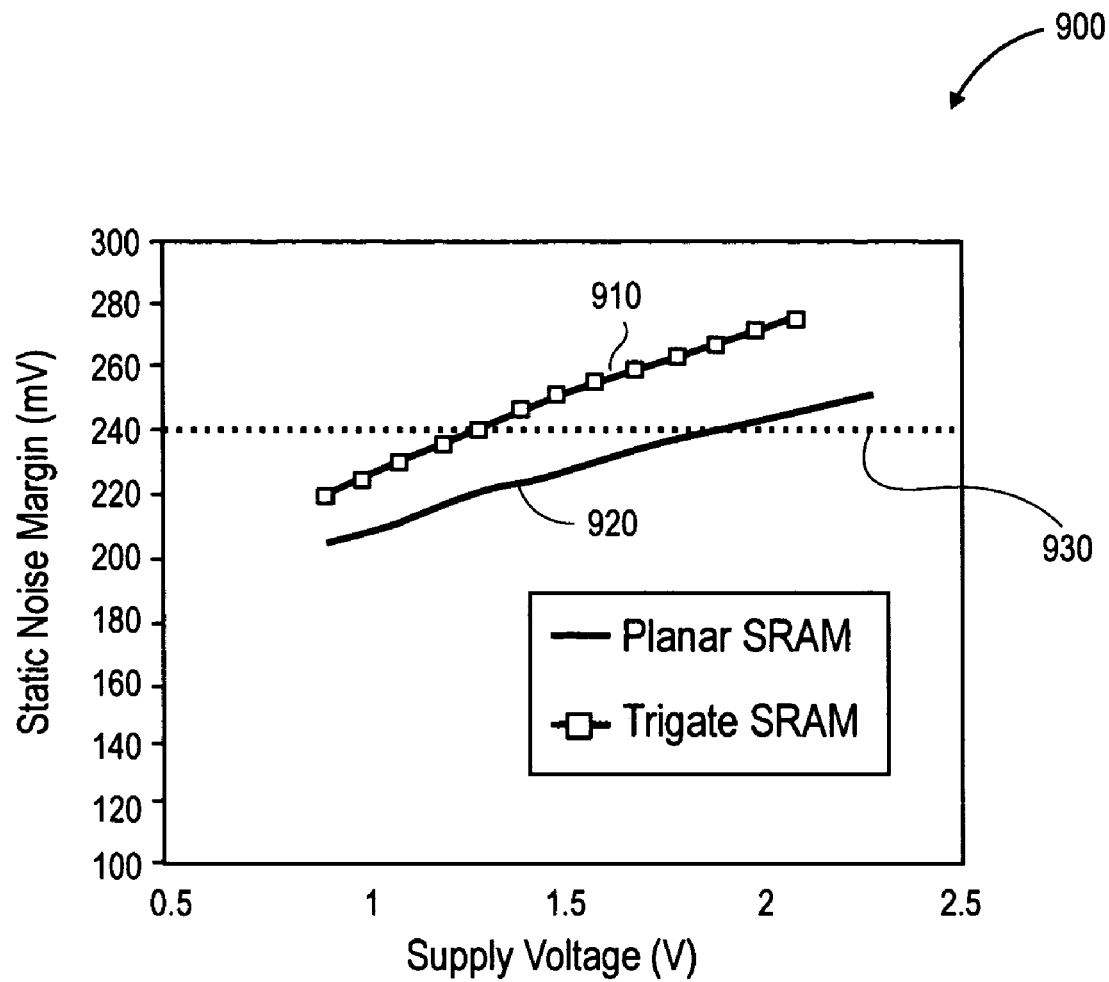
FIG. 9 is a graph which compares SNM as a function of supply voltage for a tri-gate SRAM according to one embodiment of the present invention and for a planar SRAM, where both SRAM cells have the same layout area.

FIG. 9 is a graph 900 which illustrates static noise margin (SNM) as a function of VCC for a planar SRAM cell 920 and a tri-gate SRAM cell 910, where the cells are the same size. A tri-gate SRAM cell design allows for lower scaling of VCC before exceeding a lower SNM limit of 240 mV (930). Because the cell ratio is higher when the SRAM cell is designed using tri-gate transistors according to one embodiment of the present invention, the supply voltage can be scaled lower without reducing the SNM below 240 mV. An SRAM cell designed using planar transistors can be operated at a supply voltage of slightly less than 2.0V without reducing the SNM to less than 240 mV. An SRAM cell of the same size, but designed using dual and single fin tri-gate transistors according to one embodiment of the present invention, may be operated at a much lower supply voltage before the SNM limit is met. The supply voltage may be as low as 1.25V before the SNM is reduced to less than 240 mV.

Figure 10:
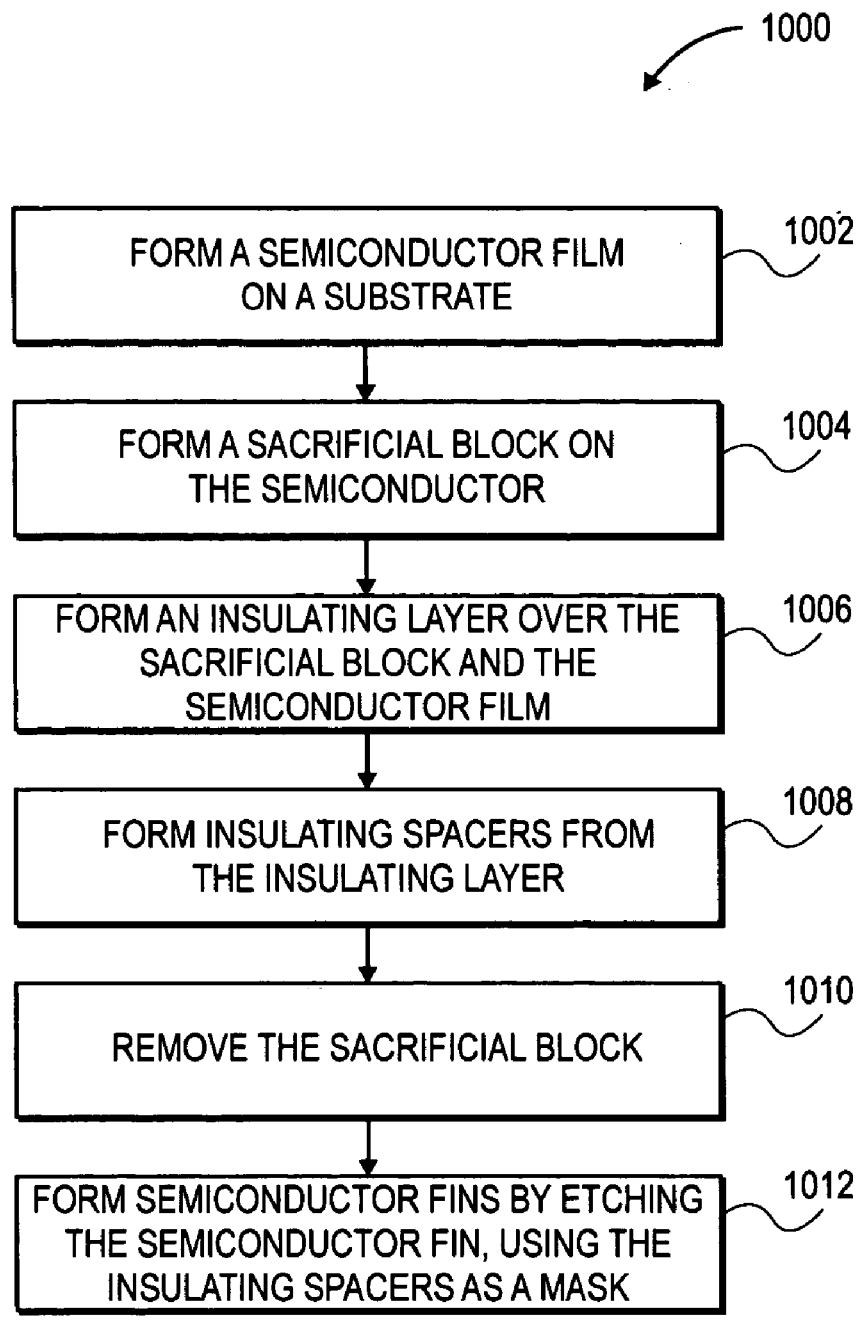
FIG. 10 is a flowchart which describes the steps in forming a dual fin tri-gate transistor according to one embodiment of the present invention.

FIG. 10 is a flow diagram, 1000, showing a process in accordance with the present invention, illustrating a general method for forming a multiple fin tri-gate transistor having a reduced layout width. Each block in flow diagram 1000 is illustrated and described in further detail below, in conjunction with FIGS. 11A–11J.

A silicon or semiconductor film is formed on an insulating substrate, as described in block 1002. The insulating substrate includes a lower monocrystalline silicon substrate and a top insulating layer, such as a silicon dioxide film or a silicon nitride film. The insulating layer is sometimes referred to as a "buried oxide" layer. In one embodiment of the present invention, the semiconductor film has a thickness of 60 nm.

A sacrificial block having a top surface and laterally opposite sidewalls is then formed on the semiconductor film, as described in block 1004. In one embodiment of the present invention, the sacrificial block is formed by first forming a layer of the sacrificial material and patterning the sacrificial material to form a block using lithography. The sacrificial block may be comprised of nitride, but is not limited to nitride. The width of the sacrificial block determines the spacing of the fins. In one embodiment of the present invention, the laterally opposite sidewalls of the sacrificial block are 60 nm apart. In another embodiment of the present invention, the laterally opposite sidewalls of the sacrificial block are separated by a distance defined by the minimum feature size that may be formed using lithography.

After forming the sacrificial block, an insulating layer is formed over and around the sacrificial block and the semiconductor film, as described in block 1006. The insulating layer may be comprised of an oxide or another insulating material. The insulating layer is deposited such that the thickness of the layer is approximately equal to the desired semiconductor fin width. In one embodiment of the present invention, the thickness of the insulating layer is between 40 and 80 nm. In another embodiment of the present invention, the thickness of the insulating layer is 60 nm.

Insulating spacers are then formed on either side of the sacrificial block by performing an anisotropic etch on the insulating layer, as described in block 1008. After the anisotropic etch, insulating spacers will remain on either side of the sacrificial block. The width of the insulating spacers will be equal to the thickness of the original insulating layer. In one embodiment of the present invention, the insulating spacers are 60 nm wide.

In another embodiment of the present invention, multiple sacrificial blocks may be formed, to form additional spacers. This method may be used to form a tri-gate transistor having more than two fins. The number of fins formed will be equal to the number of insulating spacers. In one embodiment of the present invention, an even number of fins (2N) may be formed. To form a tri-gate transistor having 2N fins, N sacrificial blocks and 2N insulating spacers are required.

After the insulating spacers are formed, the sacrificial block may be removed by conventional methods, as shown in block 1010. For example, a selective etch process may be used to remove the sacrificial block, while the insulating spacers remain intact.

Next, two semiconductor fins are formed by etching the semiconductor film using the insulating spacers as a mask, as shown in block 1012. The semiconductor film is etched away in areas not covered by the insulating spacers, exposing the insulating substrate. Each semiconductor fin formed has a top surface and a pair of laterally opposite sidewalls. Using the insulating spacers as a mask allows the fins to be separated by a distance that is less than the distance that could be achieved using current lithographic technology. Current lithography allows printing of features having minimum sizes near 60 nm and minimum spacing between features of near 240 nm. Using an embodiment of a method according to the present invention, the fins can be formed less than 240 nm apart. In one embodiment of the present invention, the fins are separated by a distance of 60 nm or less.

Figure 11A:
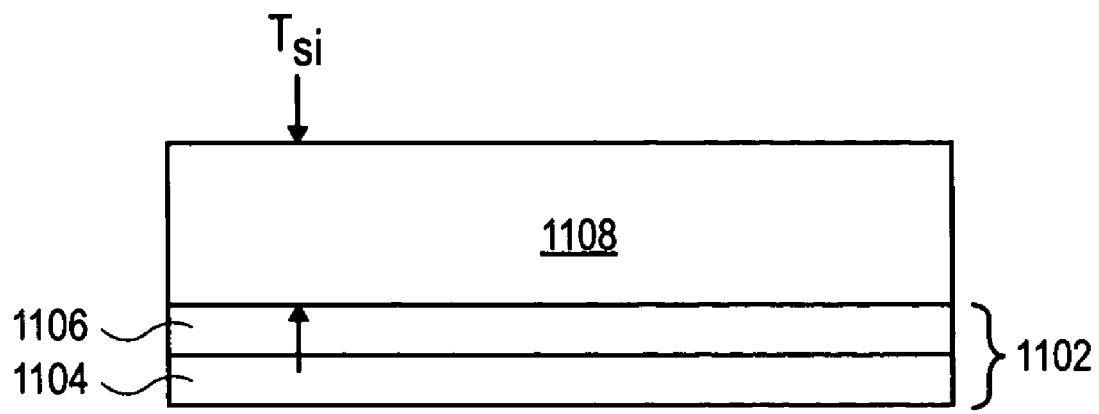
FIGS. 11A–11J illustrate the formation of a dual fin tri-gate transistor according to one embodiment of the present invention.

FIGS. 11A through 11J illustrate the formation of a dual fin tri-gate transistor according to one embodiment of the present invention. The fabrication of a dual fin tri-gate transistor begins with an insulating substrate 1102, as shown in FIG. 11A. A silicon or semiconductor film 1108 is formed on insulating substrate 1102. Insulating substrate 1102 may be comprised of a lower monocrystalline silicon substrate 1104 and a top insulating layer 1106, such as a silicon dioxide or silicon nitride film. Insulating layer 1106 isolates semiconductor film 1108 from substrate 1104, and is sometimes referred to as a "buried oxide" layer. Semiconductor film 1108 may be comprised of silicon or another semiconductor, such as but not limited to germanium (Ge), a silicon-germanium alloy ($Si_xGe_y$), gallium arsenide (GaAs), InSb, GaP, GaSb, or carbon nanotubes. The semiconductor film 1108 may be an intrinsic, or undoped, silicon film, or it may be doped to a p-type or n-type conductivity. The semiconductor film 1108 is formed to a thickness, Tsi, which is approximately equal to the height desired for the subsequently formed semiconductor fins of the tri-gate transistor. In one embodiment of the present invention, the semiconductor film 1108 has a thickness of 60 nm or less.

Figure 11B:
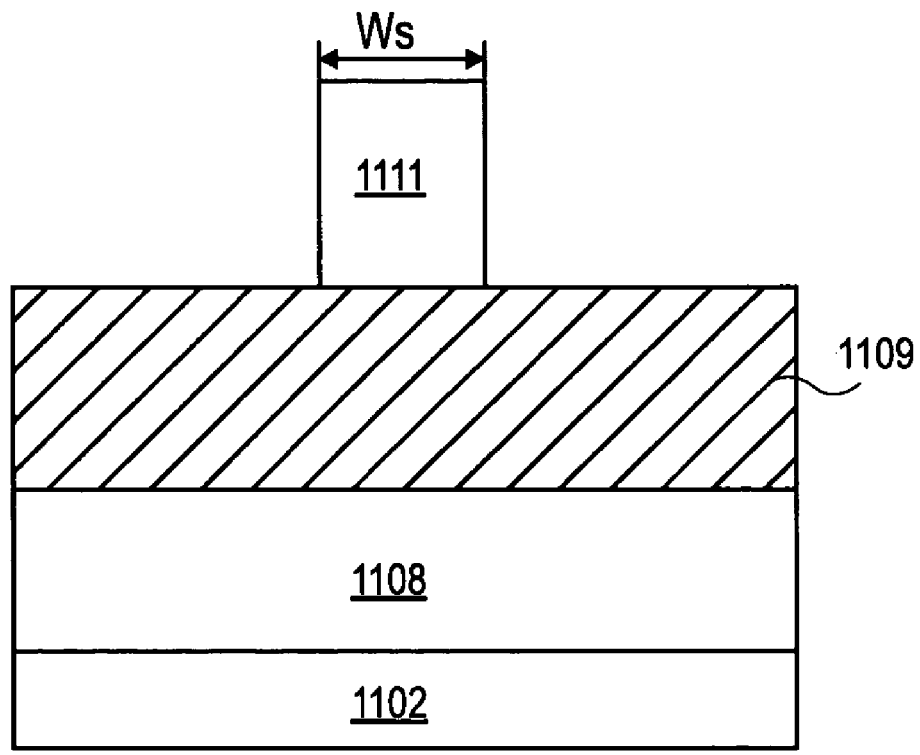

FIG. 11B illustrates the formation of a sacrificial block on the top surface of semiconductor film 1108. The sacrificial block may be formed by conventional semiconductor manufacturing techniques, including but not limited to depositing a layer of the sacrificial material, 1109, and subsequently patterning the layer with resist 1111. The sacrificial material that is not covered by resist 1111 may be etched to form one or more sacrificial blocks in the desired location(s). In one embodiment of the present invention, the sacrificial material 1109 is comprised of a nitride. The width of the sacrificial block to be formed, Ws, will define the subsequent spacing of the semiconductor fins of the tri-gate transistor. In one embodiment of the present invention, Ws is 60 nm or less. The use of a sacrificial block allows the semiconductor fins to be separated by distances of 60 nm or less, which is significantly less than the distance between features that can be achieved by conventional lithography techniques.

Figure 11C:
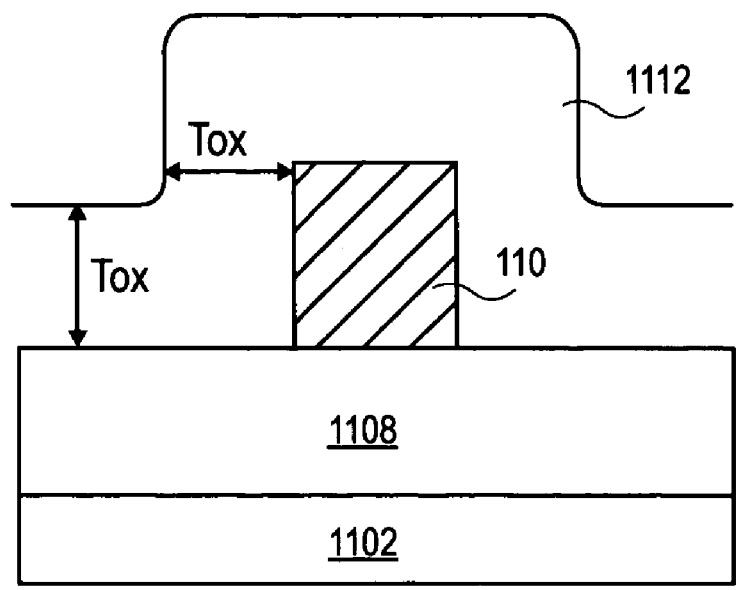

FIG. 11C illustrates the formation of an insulating layer 1112 over and around the insulating block 1110 and over the surface of the semiconductor film 1108. In one embodiment of the present invention, the insulating layer is comprised of an oxide. The insulating layer 1112 is deposited in a manner which allows the layer to have a uniform thickness, Tox. The thickness of the insulating layer will determine the width of the semiconductor fins in a subsequent processing step. In one embodiment of the present invention, the insulating layer has a thickness of 60 nm or less.

Figure 11D:
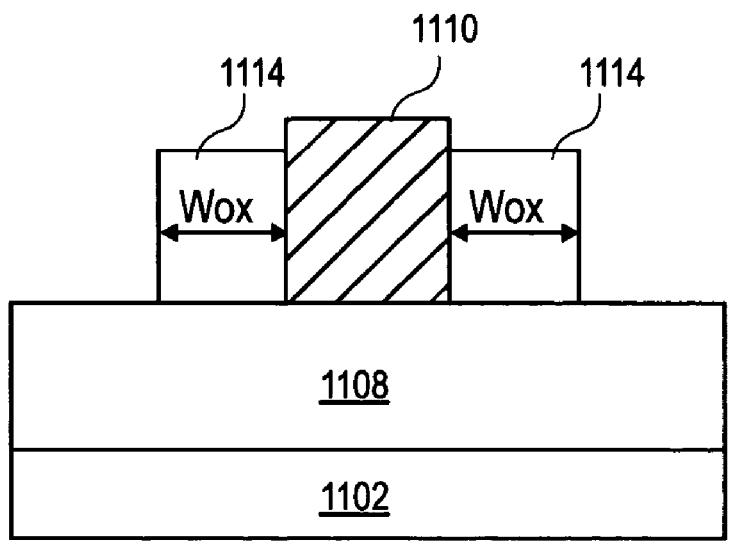

FIG. 11D illustrates the formation of insulating spacers 1114. Insulating spacers 1114 are formed by performing an anisotropic etch on the insulating layer 1112 of FIG. 11C. The anisotropic etch is performed in a manner that allows the insulating layer to be entirely removed from the top surface of the sacrificial block 1110, but leaves insulating spacers 1114 on either side of the sacrificial block. The insulating spacers 1114 are formed having a width, Wox, which is equal to the thickness of the insulating film of FIG. 11C, Tox. In one embodiment of the present invention, the width, Wox, of each insulating spacer is 60 nm or less.

Figure 11E:
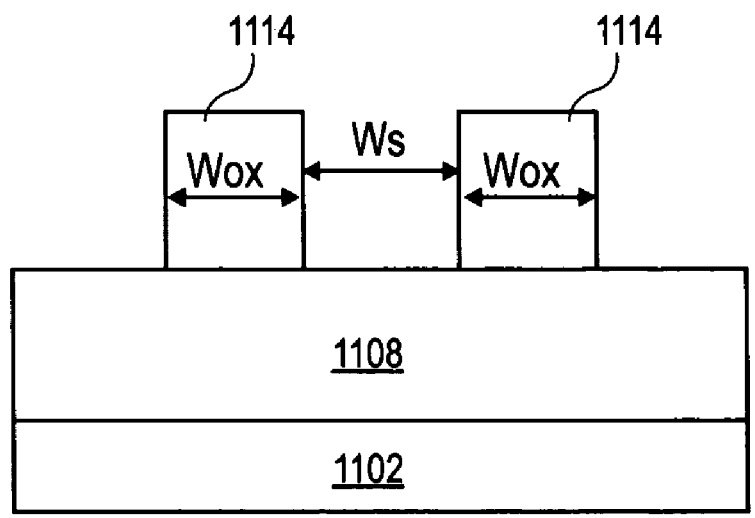

FIG. 11E illustrates the structure formed after the removal of the sacrificial block. The sacrificial block may be removed by conventional methods, including the use of a selective etch process. For example, a wet etch may be used to remove a sacrificial nitride block, while the oxide spacers will remain unaffected by the etch process. After the sacrificial block is removed, two insulating spacers 1114 remain, each spacer having a width equal to Wox. The spacers are separated by a distance equal to the width of the sacrificial block, Ws.

Figure 11F:
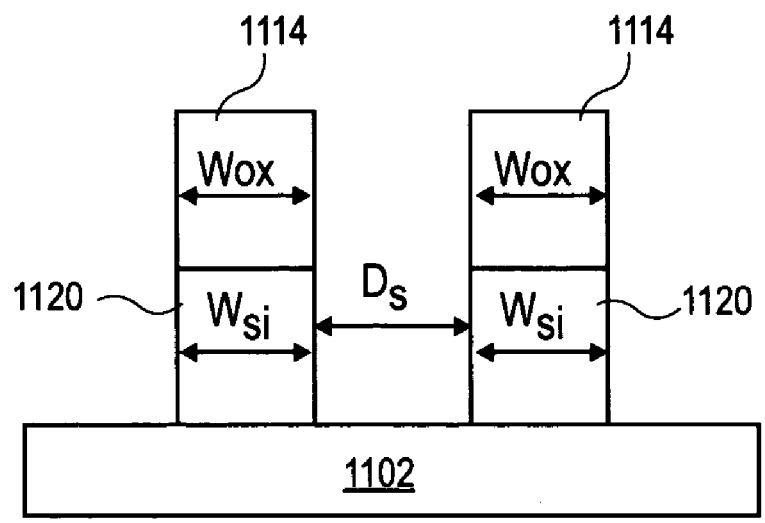

FIG. 11F illustrates the formation of semiconductor fins 1120. Semiconductor fins 1120 are formed by etching semiconductor film 1108 using insulating spacers 1114 as a mask. In one embodiment of the present invention, the etch is a plasma dry etch process. The semiconductor film is etched completely, exposing the surface of insulating substrate 1102. The semiconductor fins are formed having a width, Wsi, which is equal to the width of the insulating spacers used as a mask. In one embodiment of the present invention, Wsi is 60 nm or less. The semiconductor fins are separated by a distance, Ds, which is equal to the width of the sacrificial block formed previously. In one embodiment of the present invention, Ds is 60 nm or less.

Figure 11G:
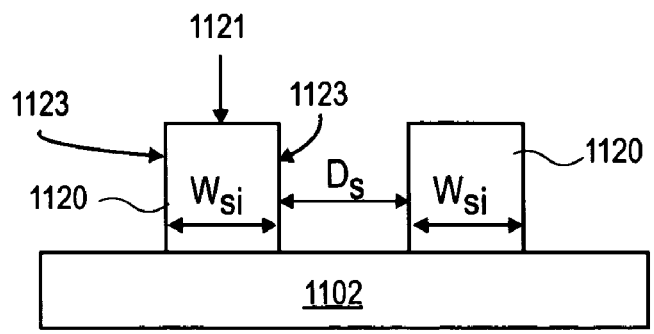

After the semiconductor fins 1120 are formed, the insulating spacers may be removed by conventional techniques, as illustrated in FIG. 11G. At this point, two semiconductor fins 1120 remain on the insulating substrate 1102. The semiconductor fins 1120 have a top surface, 1121, and laterally opposite sidewalls, 1123. The total layout width of the device will be equal to Wsi+Ds+Wsi. In one embodiment of the present invention, the total layout width of the device is 180 nm or less.

Figure 11H:
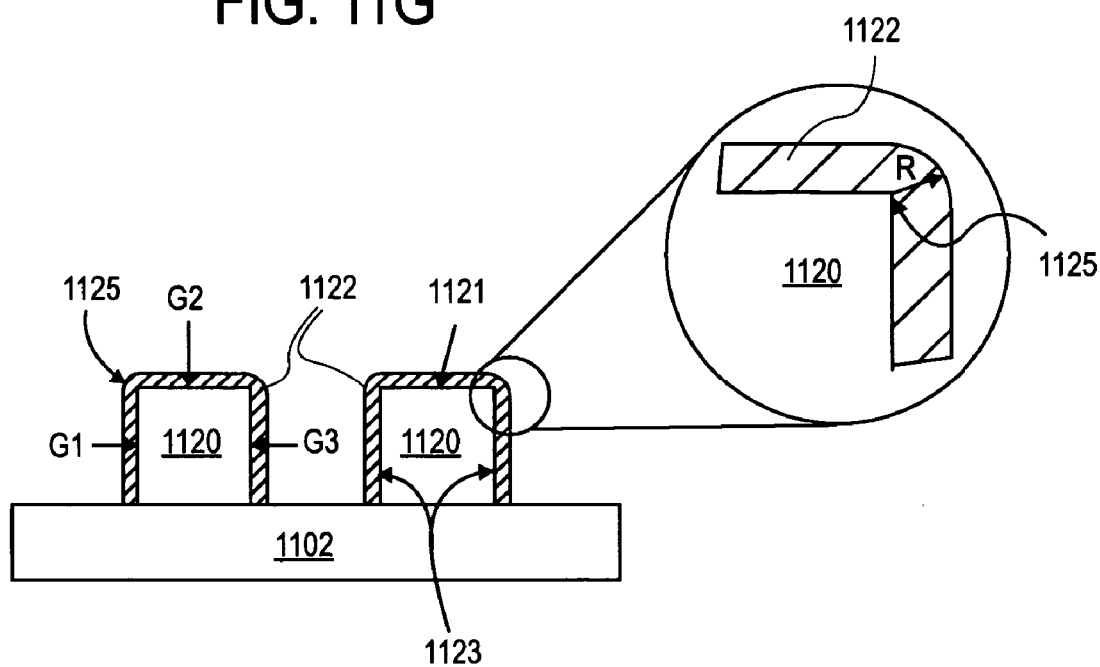

FIG. 11H illustrates the formation of a gate dielectric layer 1122 on the top surface 1121 and on the sidewalls 1123 of each semiconductor fin 1120. The tri-gate transistor can be designed to be inherently immune from Vt instability by careful control over the geometry of the corners 1125 of the semiconductor fin. The corner of the semiconductor fin is formed by the intersection of adjacent gates, G1, G2, and G3, (top and side) of the device. Because the corner 1125 of the tri-gate transistor turns on first, it determines the threshold voltage (Vt) of the device. When Vt is set only by dopant implants, there may be fluctuations in the dopants which in turn can cause Vt fluctuations. When corner rounding is controlled, the tri-gate transistor is not dependent on doping to set the Vt, and so the transistor can be designed to be inherently immune from Vt instability. Corner rounding of the silicon fin arises primarily from the gate dielectric formation process. The gate dielectric 1122 may be grown or deposited on the surface and sidewalls of the silicon fin. In one embodiment of the present invention, the gate dielectric layer is deposited using Atomic Layer Deposition (ALD), which allows corner rounding to be controlled to atomic dimensions. In one embodiment of the present invention, the radius of curvature, R, of each corner of the semiconductor fin is less than 10 nm.

Figure 11I:
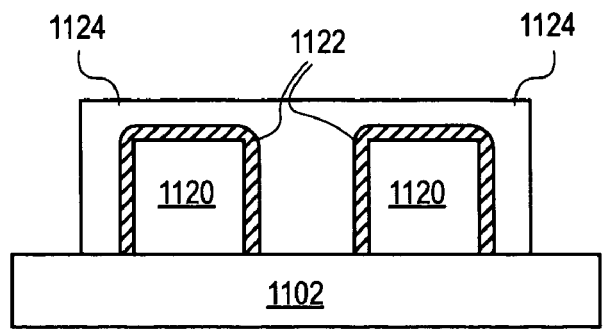

Next, a gate material is deposited over the top surface and sidewalls of each semiconductor fin and over the insulating substrate, as illustrated in FIG. 11I. The gate material is patterned to form a gate electrode 1124 on the gate dielectric layer.

Figure 11J:
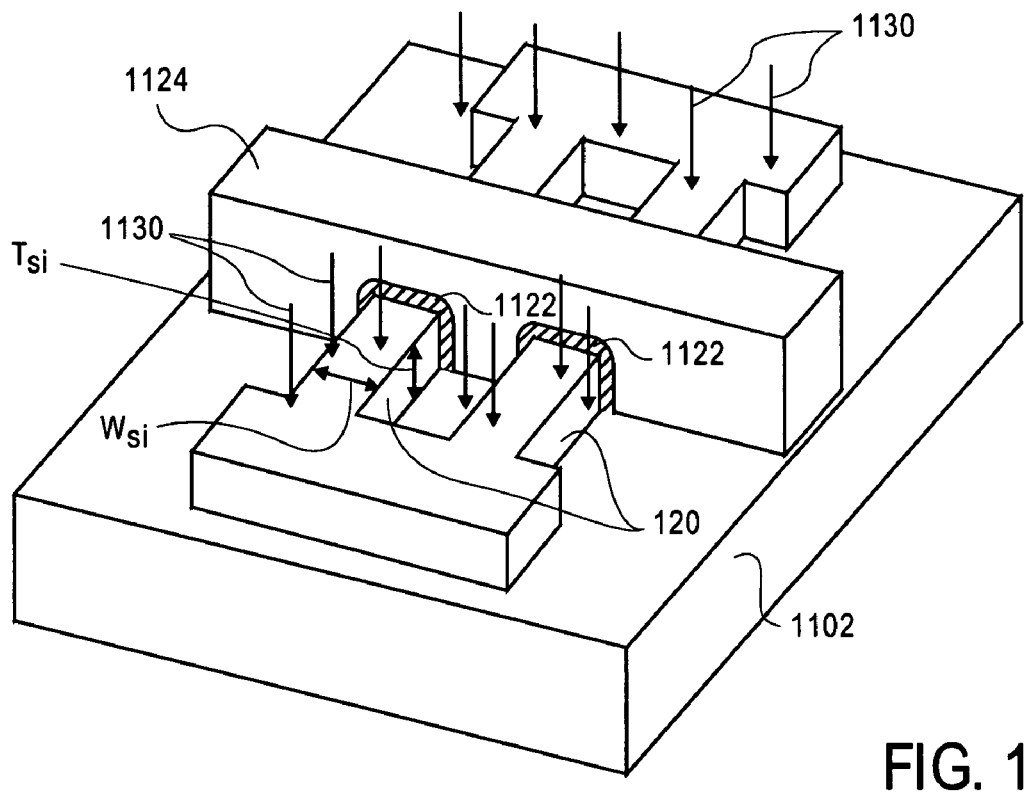

After the gate electrode is formed, a pair of source/drain regions is formed in each semiconductor fin on opposite sides of the gate electrode, as illustrated in FIG. 11J. In one embodiment of the present invention, source and drain regions are formed by implanting N-type or P-type dopants into the semiconductor body, as illustrated by arrows 1130. In embodiments of the present invention, further operations may be performed on the tri-gate device, including, but not limited to, formation of tip or source/drain extension regions, halo regions, heavily doped source/drain contact regions, silicon deposited on the source/drain and gate electrode regions, and silicide formation on the source/drain and gate electrode regions.

As illustrated in FIG. 11J, each semiconductor fin of the resulting dual fin tri-gate transistor has a gate width that is equal to 2Tsi+Wsi. The gate width for the dual fin tri-gate transistor is equal to the sum of the gate widths for each fin, or 2(2Tsi+Wsi). The device may be manufactured in an area having a layout width of 2Wsi+Ds. In one embodiment of the present invention, the gate width of the dual fin tri-gate transistor is 360 nm or less, and the device is formed in an area having a layout width of 180 nm or less.

In other embodiments of the present invention, the method set forth above may be used to form tri-gate transistors having more than two semiconductor fins.

We claim:

1. A method of forming a semiconductor device, comprising:
   forming a silicon film on a substrate;
   forming a sacrificial block on the silicon film, the sacrificial block having laterally opposite sidewalls;
   depositing an insulating layer over the sacrificial block and the silicon film;
   forming an insulating spacer on each of the laterally opposite sidewalls of the sacrificial block by performing an anisotropic etch on the insulating layer;
   removing the sacrificial block;
   forming two silicon fins by etching through the silicon film to the substrate using the insulating spacers as a mask, wherein each silicon fin has a top surface and a pair of laterally opposite sidewalls;
   removing the insulating spacers to expose the top surface of each silicon fin; and
   forming a gate dielectric layer on the top surface and on the sidewalls of each silicon fin by atomic layer deposition (ALD), wherein each silicon fin has at least one corner with a radius of curvature of less than 10 nm being defined by the atomic layer deposition of the gate dielectric layer at the corner of the silicon fin.

2. The method of claim 1, wherein the substrate is an insulating substrate.

3. The method of claim 2, wherein the sacrificial block is comprised of nitride.

4. The method of claim 1, wherein the insulating layer is comprised of an oxide layer.

5. The method of claim 1, wherein the thickness of the silicon film is 60 nm.

6. The method of claim 1, wherein the laterally opposite sidewalls of the sacrificial block are 60 nm apart.

7. The method of claim 1, wherein the sacrificial block is defined by lithography.

8. The method of claim 1, wherein the thickness of the insulating layer is between 40 and 80 nm.

9. The method of claim 1, wherein the thickness of the insulating layer is 60 nm.

10. The method of claim 1, wherein the two silicon fins are separated by a distance of 60 nm or less.

11. The method of claim 1, further comprising depositing a gate material over the top surface and sidewalls of each silicon fin and over the insulating substrate.

12. The method of claim 11, further comprising patterning the gate material to form a gate electrode on the gate dielectric layer.

13. The method of claim 12, further comprising forming a pair of source/drain regions in each silicon fin on opposite sides of the gate electrode.

* * * * *